United States Patent [19]
Yamakawa

[11] Patent Number: 5,402,020
[45] Date of Patent: Mar. 28, 1995

[54] LOW VOLTAGE DETECTING CIRCUIT

[75] Inventor: Isao Yamakawa, Kawasaki, Japan

[73] Assignee: Kabushiki Kaisha Toshiba, Tokyo, Japan

[21] Appl. No.: 242,056

[22] Filed: May 13, 1994

Related U.S. Application Data

[63] Continuation of Ser. No. 82,439, Jun. 28, 1993, abandoned, which is a continuation of Ser. No. 791,520, Nov. 14, 1991, abandoned.

[30] Foreign Application Priority Data

Nov. 16, 1990 [JP] Japan ................................. 2-310875
Oct. 21, 1991 [JP] Japan ................................. 3-272199

[51] Int. Cl.$^6$ ............................................. H03K 5/08
[52] U.S. Cl. ...................................... 327/312; 327/72; 327/306; 327/313; 327/327; 327/427; 327/432
[58] Field of Search ............... 307/350, 354, 356, 358, 307/359, 546, 547, 549, 567, 571, 291, 570, 540

[56] References Cited

U.S. PATENT DOCUMENTS

| | | | |
|---|---|---|---|
| 3,845,405 | 10/1974 | Leidich | 307/547 |
| 4,533,845 | 8/1985 | Bynum et al. | |
| 4,590,392 | 5/1986 | Vu | 307/446 |
| 5,111,071 | 5/1992 | Kwan et al. | 307/350 |

FOREIGN PATENT DOCUMENTS

2619972A1  3/1989  France .

0092034  7/1980  Japan ................................. 307/254

OTHER PUBLICATIONS

Donald L. Zaremba Jr., "How Current Sense Technology Improves Power MOSFET Switching Applications", *8079 Electro/86 and Mini/micro Northeast 11 Conference Record*, Los Angeles, Ca., pp. 1–4 (1986).

*Primary Examiner*—Terry D. Cunningham
*Attorney, Agent, or Firm*—Finnegan, Henderson, Farabow, Garrett & Dunner

[57] ABSTRACT

Disclosed herein is a circuit for limiting the output current $I_O$ of a power MOSFET $T_1$. A resistor $R_2$ converts the current $I_O$ into a low voltage $V_O$. The low voltage $V_O$ is detected by a low-voltage detecting circuit. When the low voltage $V_O$ is higher than a predetermined value $V_{OL}$, the output current $I_O$ of the power MOSFET $T_1$ is limited. The low-voltage detecting circuit comprises bipolar transistors $Q_1$ to $Q_4$. The base and collector of the transistor $Q_1$ are connected to each other. The collector of the transistor $Q_2$ is connected to the emitter of the transistor $Q_1$. The base and emitter of the transistor $Q_3$ are connected to the bases of the transistors $Q_1$ and $Q_2$, respectively. The base and collector of the transistor $Q_4$ are connected to the emitters of the transistors $Q_1$ and $Q_3$, respectively. The low voltage $V_O$ is applied to the node between the emitters of the transistors $Q_2$ and $Q_4$.

7 Claims, 5 Drawing Sheets

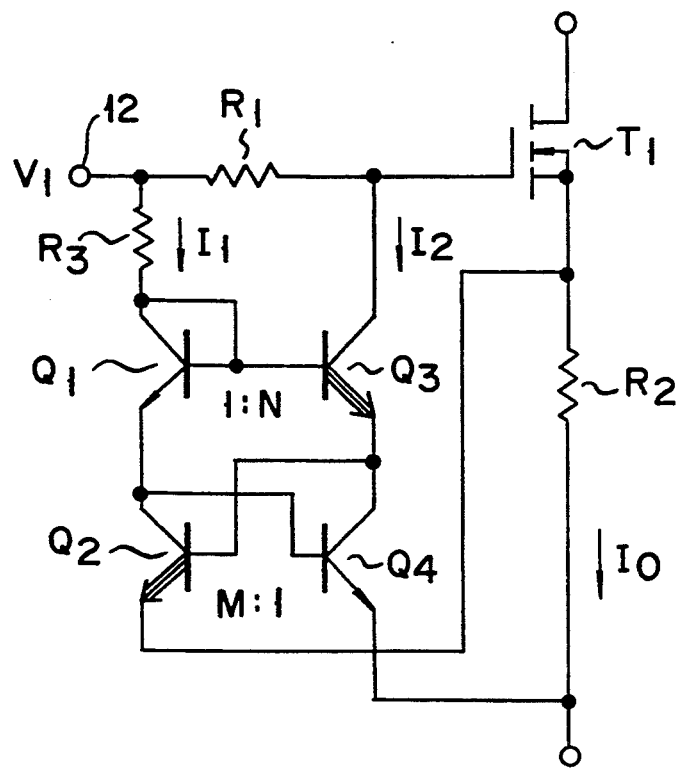
F I G. 5
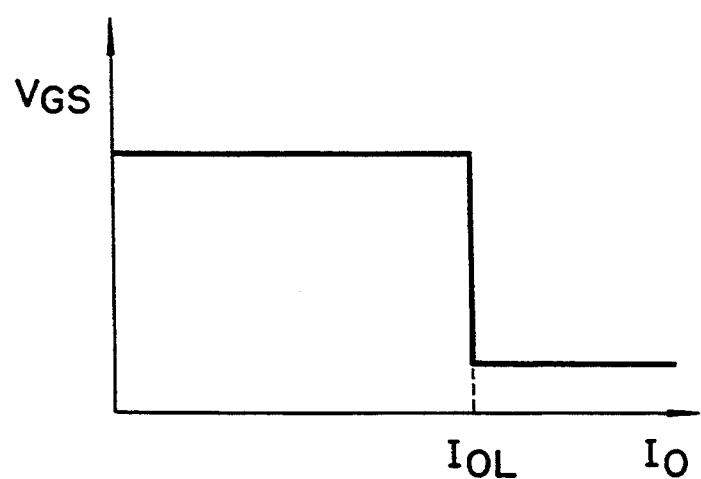
F I G. 6

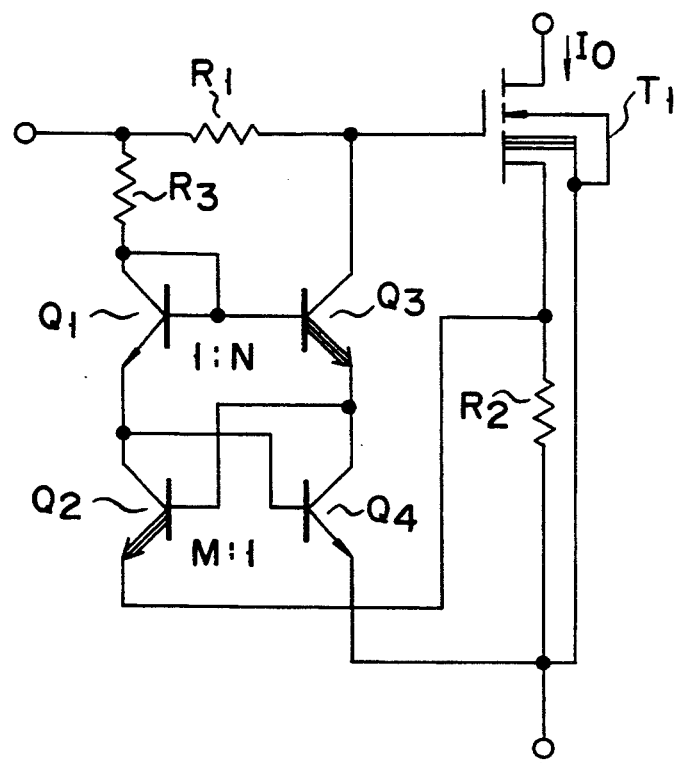
F I G. 7
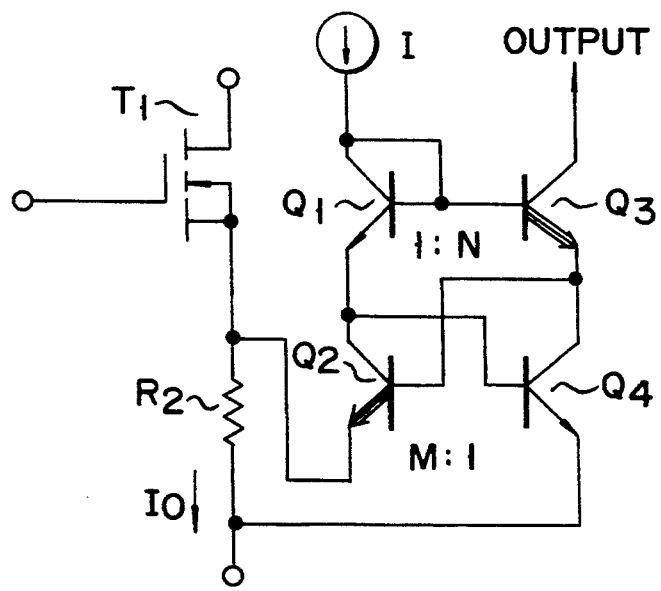
F I G. 8

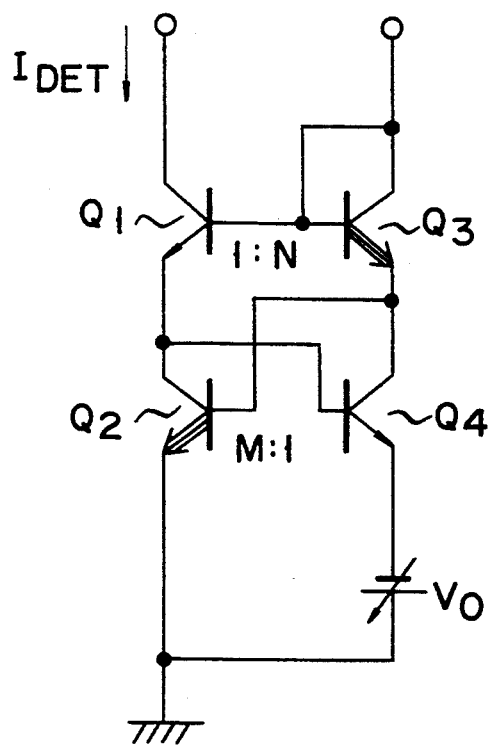
F I G. 9
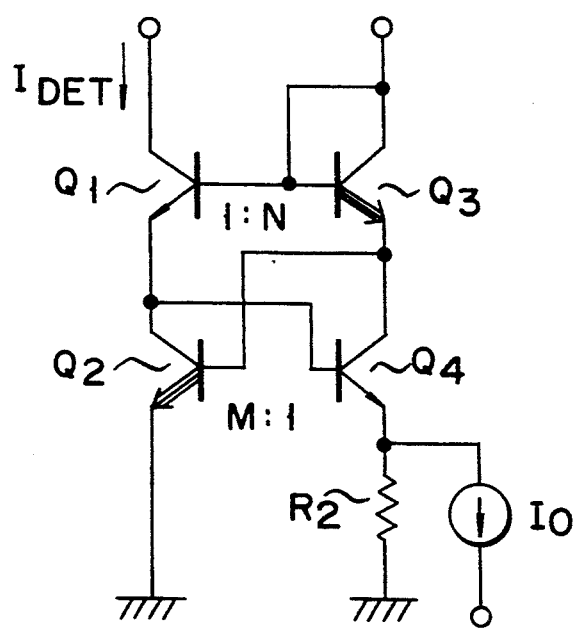
F I G. 10

LOW VOLTAGE DETECTING CIRCUIT

This application is a continuation of application Ser. N. 08/082,439, filed Jun. 28, 1993, now abandoned, which is a continuation of application Ser. No. 07/791,520, filed Nov. 14, 1991, abandoned.

BACKGROUND OF THE INVENTION

1. Field of the Invention

The present invention relates to a circuit for detecting a low voltage, and also to a current-limiting circuit for limiting the output current of a power device when the low voltages rises above a predetermined value.

2. Description of the Related Art

FIG. 1 shows a power device $T_1$ designed to function as a main switch, and also a current-limiting circuit 11 for limiting the current flowing through the power device $T_1$. The current-limiting circuit 11 comprises a lateral NPN transistor $Q_1$ and two resistors $R_1$ and $R_2$ (e.g., diffusion resistors, polysilicon resistors, or aluminum wiring). Advantageously, this circuit 11 can be formed on a chip, by a method substantially identical to the method of manufacturing a discrete power transistor.

The current-limiting circuit 11 can restrict the output current $I_O$ of the power device $T_1$. More precisely, when the output current $I_O$ increases over the value $I_{OL}$ given below, the transistor $Q_1$ is turned on, thereby limiting the output current $I_O$ of the power device $T_1$.

$$I_O \geq I_{OL} \approx \frac{V_{BEQ1}}{R_2} \tag{1}$$

To limit the output current $I_O$ of the device $T_1$, the voltage drop made by the resistor $R_2$ must be greater than the voltage $V_{BEQ1}$ which turns on the transistor $Q_1$. Inevitably, the current-limiting circuit 11 has a great power loss $P_D$, which is given as follows:

$$P_D = I_{OL} \times V_{BEQ1} = I_{OL}^2 \times R_2 \tag{2}$$

In practice, not only the power loss $P_D$, but also the power loss $P_D'$ should be considered, which is made by the resistance $R_{DS}$ existing between the drain and source of the power device $T_1$. The total power loss $P_{DT}$ in the circuit comprised of the device $T_1$ and the circuit 11 is, therefore, considerably large, as can be understood from the following equation (3).

$$P_{DT} = P_D + P_D' = I_{OL}(V_{BEQ1} + V_{DS(ON)}) \tag{3}$$
$$= I_{OL}^2(R_2 + R_{DS})$$

where $V_{DS(ON)}$ is the drain-source voltage of the power device $T_1$.

FIG. 2 shows a power device $T_1$ designed to function as a main switch and developed to solve the problem with the circuit shown in FIG. 1, and also a current-limiting circuit 11 identical to the circuit 11 shown in FIG. 1, used for limiting the current flowing through the power device $T_1$. As is evident from FIG. 2, the power device $T_1$ comprises a plurality of small cells. The small cells are divided into two groups, the first consisting of n times as many cells as the the second group, where n is a number greater than 1. Hence, the output current $I_O$ of the device $T_1$ is divided into two parts having magnitudes n and 1, respectively. Hence, the current $I_O'$, defined below, is supplied to the resistor $R_2$.

$$I_O' = \frac{1}{N+1} \cdot I_O \tag{4}$$

In the circuit shown in FIG. 2, when the output current $I_O$ of the power device $T_1$ increases above the value $I_{OL}$ defined by equation (5), the transistor $Q_1$ is turned on, whereby the current $I_O$ is limited.

$$I_O \geq I_{OL} \approx (n+1) \cdot \frac{V_{BEQ1}}{R_2} \tag{5}$$

If $n \gg 1$, the power loss $P_D$ made by the resistor $R_2$ can be neglected. Therefore, it suffices to consider the power loss $P_D'$ resulting from the drain-source resistor $R_{DS}$ of the power device $T_1$. Hence, the total power loss $P_{DT}$ in the circuit comprised of the device $T_1$ and the circuit 11 is less than that in the circuit of FIG. 1.

$$P_{DT} = P_D' = I_{OL} \times V_{DS(ON)} = I_{OL}^2 \times R_{DS} \tag{6}$$

To cause a current to flow through the power device $T_1$, the following relation (7) must avail:

$$V_{DS(ON)} > V_{BEQ1} \tag{7}$$

The total power loss $P_D$ in the circuit of FIG. 2 is greater than $I_L V_{BEQ1}$ as can be understood from the following equation:

$$P_{DT} = I_{OL} \times V_{DS(ON)} > I_{OL} \times V_{BEQ1} \tag{8}$$

In either conventional current-limiting circuit 11 described above, use is made of the base-emitter voltage $V_{BEQ1}$ (about 0.6 V) of the transistor $Q_1$ to detect the output current $I_O$ of the power device $T_1$. The power loss $P_{DT}$ of the circuit comprising the device $T_1$ and the circuit 11 is inevitably large.

SUMMARY OF THE INVENTION

The object of the invention is to provide a circuit which can detect a low voltage, and also to provide a current-limiting circuit for limiting the output current of an intermediate or high power transistor, in which the low-voltage detecting circuit is used to reduce the total power loss of the current-limiting circuit and the power transistor.

In an aspect of this invention, there is provided a low-voltage detecting circuit which comprises: a first transistor whose base and collector are connected to each other; a second transistor whose collector is connected to the emitter of the first transistor; a third transistor whose base is connected to the base of the first transistor and whose emitter is connected to the base of the second transistor; a fourth transistor whose base is connected to the emitter of the first transistor and whose collector is connected to the emitter of the third transistor; and a voltage source connected between the emitter of the second transistor and the emitter of the fourth transistor. When the output voltage of the voltage source rises above a predetermined value, the collectors of the first and second transistors output a signal indicative of this fact.

In another aspect of the present invention, there is provided a current-limiting circuit which includes the low-voltage detecting circuit described above, and which is designed to limit the output current of a power device. The current-limiting circuit according to the invention comprises, besides the low-voltage detecting circuit and the power device: a first resistor connected at one end to the control electrode of the power device, and at the other end to the voltage source for the low-voltage detecting circuit; a second resistor connected to the output of the power device, for detecting the output current of the power device; and a third resistor connected at one end to the voltage source, and at the other end to the collector of the first transistor of the low-voltage detecting circuit. The collector of the third transistor is connected to the control electrode of the power device. The emitter of the second transistor is connected to the first end of the second resistor. The emitter of the fourth transistor is connected to the second end of the second resistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram showing a circuit designed to limit the output current of a power transistor and having the low-voltage detecting circuit shown in FIG. 1;

FIG. 6 is a graph representing the relationship between the gate-source voltage $V_{GS}$ and output current $I_0$ of a main power transistor;

FIGS. 7 and 8 are circuit diagrams showing two modifications of the current-limiting circuit shown in FIG. 5; and FIGS. 9 and 10 are circuit diagrams showing low-voltage detecting circuits according to two other embodiments of the invention, respectively.

DETAILED DESCRIPTION OF THE PREFERRED EMBODIMENTS

An embodiment of the present invention will now be described, with reference to the accompanying drawings.

Figure 3:
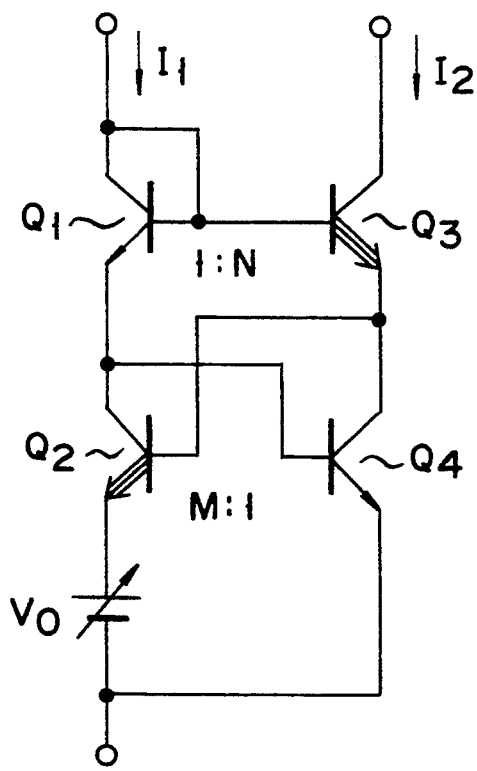
FIG. 3 is a circuit diagram showing a low-voltage detecting circuit according to one embodiment of the present invention.

FIG. 3 shows a low-voltage detecting circuit according to a first embodiment of the invention, which comprises four lateral NPN transistors $Q_1$, $Q_2$, $Q_3$, and $Q_4$. The transistor $Q_3$ has an emitter area N times greater than that of the transistor $Q_1$, where N is a number other than 1. The transistor $Q_2$ has an emitter area M times greater than that of the transistor $Q_4$. A current $I_1$ is supplied to the transistors $Q_1$ and $Q_2$, operating these transistors, and also to the base of the transistor $Q_3$. The low-voltage detecting circuit is designed to detect a low voltage $V_0$. A control current $I_2$ flows through the circuit when the low voltage $V_0$ rises above a predetermined value $V_{OL}$.

The voltage $V_{OL}$ can be calculated as follows, from the base-emitter voltages of the transistors $Q_1$ to $Q_4$. First, the currents $I_1$ and $I_2$ are given as follows:

$$I_1 = I_{sat1} \cdot e^{\frac{q}{kT} V_{BEQ1}} \quad (9)$$
$$= M \cdot I_{sat2} \cdot e^{\frac{q}{kT} V_{BEQ2}}$$

$$I_2 = N \cdot I_{sat1} \cdot e^{\frac{q}{kT} V_{BEQ3}} \quad (10)$$
$$= I_{sat2} \cdot e^{\frac{q}{kT} V_{BEQ4}}$$

The base-emitter voltages of the transistors $Q_1$ to $Q_4$ have the following relationship:

$$V_{BEQ1} + V_{BEQ4} = V_{BEQ3} + V_{BEQ2} + V_{OL}$$

$$V_{OL} = V_{BEQ1} - V_{BEQ2} + V_{BEQ4} - V_{BEQ3} \quad (11)$$

Equation (9) can be formed into the following equation (9)':

$$V_{BEQ1} - V_{BEQ2} = \frac{kT}{q} \ln\left(\frac{M \cdot I_{sat2}}{I_{sat1}}\right) \quad (9)'$$

equation (10) can be transformed into the following equation (10)':

$$V_{BEQ4} - V_{BEQ3} = \frac{kT}{q} \ln\left(\frac{N \cdot I_{sat1}}{I_{sat2}}\right) \quad (10)'$$

From equations (9)' and (10)', the voltage $V_{OL}$ is found to have the value given as follows:

$$V_{OL} = \frac{kT}{q} \ln(N \cdot M) \quad (12)$$

Equation (12) shows that the voltage $V_{OL}$ does not depend on the current $I_2$. Rather, it is determined by the ratio of the emitter area of the transistor $Q_1$ to that of the transistor $Q_3$, and also by the ratio of the emitter area of the transistor $Q_2$ to that of the transistor $Q_4$. In other words, the low voltage $V_0 (= V_{OL})$, which is defined by equation (12), can be detected by selecting appropriate values for N and M. In addition, the power loss of the low-voltage detecting circuit can be less than that of the conventional one, since the voltage $V_{OL}$ can be far lower than the base-emitter voltage of, for example, the transistor $Q_1$ shown in FIG. 1.

The control current $I_2$ and the detected voltage $V_0$ can have the following relationships:

(1) When $V_0 < V_{OL}$, $I_2 \approx 0$
(2) When $V_0 = V_{OL}$, $I_2$ increases exponentially
(3) When $V_0 > V_{OL}$, $I_2$ keeps flowing until it reaches the maximum value determined by the current $I_1$ and the current ability (e.g., amplification factor) of the NPN transistors.

Figure 4:
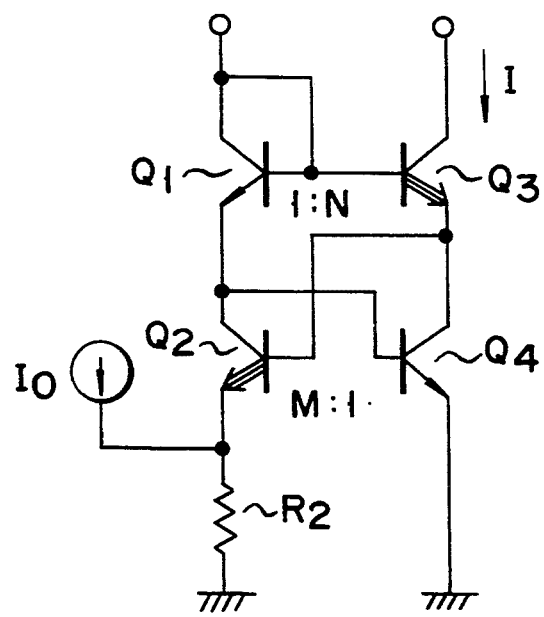
FIG. 4 is a circuit diagram showing a modification of the low-voltage detecting circuit shown in FIG. 3.

FIG. 4 shows a modification of the low-voltage detecting circuit shown in FIG. 3. This circuit is identical to the circuit of FIG. 3, except that a resistor $R_2$ and a current source $I_0$ are used in place of the low voltage $V_O$. In this circuit, when a current $I_0$ increases over a predetermined current $I_{OL}$ defined by the following equation (13), the control current $I_2$ can flow through the transistors $Q_3$ and $Q_4$.

$$I_{OL} = \frac{1}{R_2} \cdot \frac{kT}{q} \ln(M \cdot N) \quad (13)$$

Figure 1:
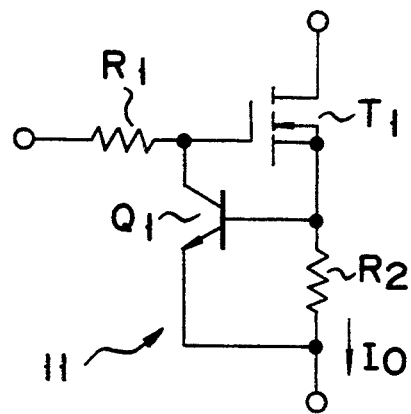
FIGS. 1 and 2 are diagrams showing two conventional current-limiting circuits, respectively.
Figure 2:
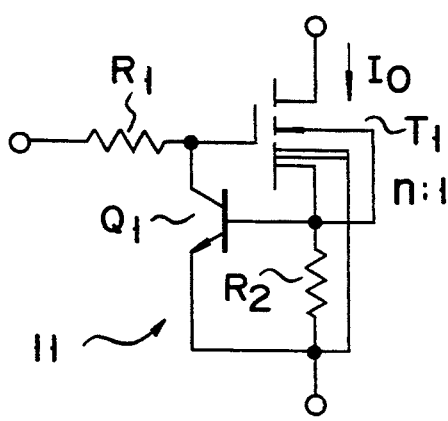

FIG. 5 shows a circuit which is designed to limit the output current of a power transistor and having the low-voltage detecting circuit shown in FIG. 1. In this circuit, the output current $I_0$ of a power MOSFET $T_1$ is supplied to a resistor $R_2$, thereby detecting the low voltage applied to a resistor $R_2$. In the current-limiting circuit shown in FIG. 5, $V_{OL} = I_{OL} \times R_2$, where $I_{OL}$ is the maximum current the power MOSFET $T_1$ can output. Based on this, equation (12) can be transformed into the following equation (14):

$$I_{OL} = \frac{1}{R_2} \cdot \frac{kT}{q} \ln(N \cdot M) \quad (14)$$

Hence, when the output current $I_0$ is less than the maximum output current $I_{OL}$ (namely, $I_0 < I_{OL}$), the current $I_2$ flowing through the transistors $Q_3$ and $Q_4$ are substantially nil. In other words, the gate-source voltage $V_{GS}$ of the power MOSFET $T_1$ is $V_1 - R_2 \times I_0$, where $V_1$ is the voltage applied to a terminal 12, which is higher than the voltage $V_{GS(ON)}$ required to turn on the power MOSFET $T_1$. Since $R_2 \times I_0$ has an extremely small value, $V_{GS}$ is nearly equal to $V_1$. Thus, the power MOSFET $T_1$ is on at all times, and its output current $I_0$ is not limited at all.

Conversely, when the output current $I_0$ is equal to or greater than the maximum output current $I_{OL}$ (namely, $I_0 \geq I_{OL}$), the current $I_2$ flowing through the transistors $Q_3$ and $Q_4$ increases greatly. As a result, the gate voltage $V_G$ of the power MOSFET $T_1$ changes to $V_1 - R_1 \times I_2$. Hence, the gate-source voltage $V_{GS}$ of the power MOSFET $T_1$ changes to about $V_1 - R_1 \times I_2$ since $R_2 \times I_0$ has an extremely small value. In other words, the power MOSFET $T_1$ is turned off when the voltage $V_{GS}$ falls below the voltage $V_{GS(ON)}$. Then, the output current $I_0$ of the power MOSFET $T_1$ is limited.

FIG. 6 represents the relationship between the gate-source voltage $V_{GS}$ and output current $I_0$ of the power MOSFET $T_1$. As can be understood from FIG. 6, the gate-source voltage $V_{GS}$ abruptly falls when the output current $I_0$ increases over the maximum value $I_{OL}$. Due to the fall of the voltage $V_{GS}$, the power MOSFET T1 is turned off. As a result, the output current $I_0$ of the power MOSFET $T_1$ is limited, however, if the voltage $V_{GS}$ falls below the voltage $V_{GS(ON)}$, and the power MOSFET $T_1$ is shut off.

The power MOSFET and the current-limiting circuit for limiting the output current of the MOSFET, both shown in FIG. 5, can be fabricated in one and the same step of the method of manufacturing an ordinary discrete power transistor. The resistor $R_2$ can be formed of an aluminum wire or a bonding wire. In addition, the power device is not limited to a power MOSFET, and can be a bipolar type transistor e.g., insulated gate bipolar transistor.

Two modifications of the current-limiting circuit shown in FIG. 5 will now be described, with reference to FIGS. 7 and 8.

The circuit shown in FIG. 7 is characterized in that the small cells constituting a power transistor $T_1$ are divided into two groups. The first consisting of n times as many cells as the second group, where n is a number greater than 1. The output current $I_O$ of the power device $T_1$ is, therefore, divided into two parts having magnitudes n and 1, respectively. Hence, the current $I_O'$, defined below, is supplied to the resistor $R_2$. Hence, $1/(n+1)$ of the current $I_O$ flows to a resistor $R_2$, thereby generating a low voltage $V_O$. In this current-limiting circuit, even if the output current $I_O$ is too large, it is unnecessary to decrease the resistance of the resistor $R_2$ in order to obtain the low voltage $V_O$. This helps to reduce the difference in resistance among the resistors which are to be used as resistor $R_2$.

The circuit shown in FIG. 8 is characterized in that a control output is obtained from the collector of a transistor $Q_3$. This circuit serves effectively, not only to detect the output current $I_O$ of the power MOSFET $T_1$, but also to utilize the output current $I_O$ with high efficiency. For example, the control output can be used for providing a current limited output.

FIGS. 9 and 10 show low-voltage detecting circuits according to two other embodiments of the invention, respectively.

In the low-voltage detecting circuit shown in FIG. 3, a low voltage $V_O$ is applied to the emitter of the transistor $Q_2$, and the ground voltage is applied to the emitter of the transistor $Q_4$. This circuit is, there fore, a "low positive-voltage detecting circuit."

By contrast, in the low-voltage detecting circuit of FIG. 9, the ground voltage is applied to the emitter of a transistor $Q_2$, and a low voltage $V_O$ is applied to the emitter of a transistor $Q_4$. The circuit is, therefore a "low negative-voltage detecting circuit." In the circuit of FIG. 9, if $V_0 > V_{OL}$, where $V_O$ is the detected voltage and $V_{OL}$ is a predetermined voltage, then $I_{DET} = 0$; and if $V_0 \leq V_{OL}$, $I_{DET} > 0$. The circuit can, therefore, detect the low voltage $V_O$.

The low-voltage detecting circuit shown in FIG. 10 is, so to speak, a modification of the circuit shown in FIG. 9. In this circuit, the low voltage $V_O$ is generated by a resistor $R_2$ and a current source $I_O$. When the absolute value of a current $I_O$ decreases to or below a predetermined value $I_{OL}$, a control current $I_{DET}$ can flow through transistors $Q_1$ and $Q_2$, as can be understood from equation (15). When the absolute value of a current $I_O$ increases above the predetermined value $I_{OL}$, the control current $I_{DET}$ cannot flow through the transistor $Q_1$ or $Q_2$, as can be understood from equation (16).

When
$$|I_O| \leq \frac{1}{R_2} \cdot \frac{kT}{q} \ln(N \cdot M) \quad (15)$$

$I_{DET} > 0,$ when $$|I_O| > \frac{1}{R_2} \cdot \frac{kT}{q} \ln(N \cdot M) \quad (16)$$

$I_{DET} \approx 0,$

As has been explained, the low-voltage detecting circuit according to the present invention can detect the low voltage $V_{OL}$ which is determined by the ratio of the emitter area of the transistor $Q_1$ to that of the transistor $Q_3$, and also by the ratio of the emitter area of the transistor $Q_2$ to that of the transistor $Q_4$. Hence, the circuit serves to limit the output current of a power device. In addition, since the output current of the power device is limited by detecting the low voltage $V_{OL}$, the power loss of the low-voltage detecting circuit is far less than that of the conventional one. For instance, if $M=N=3$, the circuit can detect a voltage which is about ten times lower than the base-emitter voltage $V_{BE}$ of the NPN transistors $Q_1$ to $Q_4$. Further, the power MOSFET and the current-limiting circuit, both incorporated in the embodiments of FIGS. 5 and 7, can be fabricated in one and the same step of the method of manufacturing an ordinary discrete power transistor. The embodiments of FIGS. 5 and 7 can, therefore, provide a power device having a current-limiting section.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A current-limiting circuit comprising:
    a power device having a control electrode;
    a first resistor connected at one end to the control electrode of said power device, and at the other end to a potential source;
    a second resistor for detecting a current output by said power device;
    a first transistor whose base and collector are connected to each other;
    a second transistor whose collector is connected to the emitter of said first transistor, and whose emitter is connected to one end of said second resistor;
    a third transistor whose base is connected to the base of said first transistor, whose collector is connected to the control electrode of said power device, and whose emitter is connected to the base of said second transistor;
    a fourth transistor whose base is connected to the emitter of said first transistor, whose collector is connected to the emitter of said third transistor, and whose emitter is connected to the other end of said second resistor; and
    a third resistor connected at one end to said potential source, and at the other end to the collector of said first transistor,
    wherein the output current of said power device is limited when the output current of said power device increases over a predetermined value.

2. The circuit according to claim 1, wherein the ratio of the emitter area of said first transistor to that of said third transistor is 1:N, where N is a number other than 1, and the ratio of the emitter area of said second transistor to that of said fourth transistor is M:1, where M is a number other than 1.

3. The circuit according to claim 1, wherein said power device is a power MOSFET.

4. The circuit according to claim 1, wherein the output current $I_O$ is divided into two parts, the first part being n times greater than the second part, where n is a number greater than 1, and a current of $I_O/(n+1)$ flows to said second resistor.

5. A circuit comprising:
    a power device having a control electrode for receiving a control input;
    a resistor for detecting an output current $I_O$ of said power device, said resistor having a first end connected to the power device and a second end;
    a first transistor whose base and collector are connected to each other, and whose collector is connected to a current source;
    a second transistor whose collector is connected to the emitter of said first transistor, and whose emitter is connected to the first end of said resistor;
    a third transistor whose base is connected to the base of said first transistor, and whose emitter is connected to the base of said second transistor; and
    a fourth transistor whose base is connected to the emitter of said first transistor, whose collector is connected to the emitter of said third transistor, and whose emitter is connected to the second end of said resistor,
    wherein an output signal is output from the collector of said third transistor when the output current $I_O$ of said power device increases over a predetermined value.

6. The circuit according to claim 5, wherein the ratio of the emitter area of said first transistor to that of said third transistor is 1:N, where N is a number other than 1, and the ratio of the emitter area of said second transistor to that of said fourth transistor is M:1, where M is a number other than 1.

7. The circuit according to claim 5, wherein said power device is a power MOSFET.

* * * * *